(12) United States Patent
Ahmed (10) Patent No.: US 10,833,633 B2
(45) Date of Patent: Nov. 10, 2020

(54) CIRCUIT AND METHOD FOR CONTROLLING A CRYSTAL OSCILLATOR

(71) Applicant: SEMICONDUCTOR COMPONENTS INDUSTRIES, LLC, Phoenix, AZ (US)

(72) Inventor: Abdullah Ahmed, Scarborough (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/226,054

(22) Filed: Dec. 19, 2018

(65) Prior Publication Data
US 2020/0204115 A1  Jun. 25, 2020

(51) Int. Cl.
*H03B 5/36* (2006.01)
*H03L 5/00* (2006.01)
*H03L 3/00* (2006.01)
*H03B 5/06* (2006.01)

(52) U.S. Cl.
CPC .............. *H03B 5/364* (2013.01); *H03B 5/06* (2013.01); *H03L 3/00* (2013.01); *H03L 5/00* (2013.01)

(58) Field of Classification Search
CPC .. H03B 5/06; H03B 5/364; H03L 5/00; H03L 3/00
See application file for complete search history.

(56) References Cited

U.S. PATENT DOCUMENTS

| 4,956,618 | A | 9/1990 | Ulmer | |
|---|---|---|---|---|
| 6,097,257 | A * | 8/2000 | Kadowaki | G04F 5/06 331/116 FE |
| 7,369,009 | B2 * | 5/2008 | Hofer | H04L 27/12 331/116 R |
| 8,736,391 | B2 | 5/2014 | Huang et al. | |
| 2010/0182094 | A1 * | 7/2010 | Nasu | H03B 5/366 331/116 FE |
| 2012/0045000 | A1 | 2/2012 | Simmons et al. | |
| 2015/0333694 | A1 | 11/2015 | Griffith et al. | |

OTHER PUBLICATIONS

Giuseppe Macera et al., "A new 1.8V Pierce-Gate crystal oscillator based on the constant gm cell in 28nm CMOS technology for automotive radar applications," 2017 IEEE International Symposium on Circuits and Systems (ISCAS) Proceedings, IEEE, 2017.

* cited by examiner

*Primary Examiner* — Jeffrey M Shin
(74) *Attorney, Agent, or Firm* — Brake Hughes Bellermann LLP (57) ABSTRACT

A crystal oscillator circuit that can be controlled for fast start-up and for efficient operation is disclosed. The control includes adjusting a voltage applied to a body terminal of a transistor in order to control the amplification of the crystal oscillator. The amplification can be increased, relative to a motional resistance of the crystal oscillator, at start-up to reduce a start-up time necessary for oscillation. The amplification can also be decreased in order to maintain oscillation after start-up more efficiently. In some implementations, the transistor for control is a fully depleted silicon on insulator (FDSOI) transistor that accommodates a wide range of body bias voltages.

20 Claims, 5 Drawing Sheets

CIRCUIT AND METHOD FOR CONTROLLING A CRYSTAL OSCILLATOR

FIELD OF THE DISCLOSURE

The present disclosure relates crystal oscillators and more specifically to a circuit and method for starting and maintaining oscillation of a crystal oscillator.

BACKGROUND

Crystal oscillators are used to provide stable signals (e.g., clock signals) for circuits. A crystal oscillator can be designed to oscillate primarily at a resonant frequency within in the kilohertz or megahertz portions of the electromagnetic spectrum. At the core of the crystal oscillator is a resonator including a piezoelectric crystalline material (e.g., quartz). When the resonator is connected in a feedback loop with an amplifier, an oscillating signal at the resonant frequency of the crystal resonator may be generated (i.e., started) and sustained (i.e., maintained).

Fast start-up of the oscillation is important, especially for electronics applications that can change between a standby mode and an active mode. For example, some low voltage (i.e., LV) or low power (i.e., LP) applications can save energy by shutting-down the oscillator during the standby mode. When the standby mode ends, the crystal oscillator is quickly started and returns to active (i.e., normal operation) mode.

The start-up of the crystal oscillator is affected by a parameter of the crystal resonator known as motional resistance (i.e., equivalent series resistance, ESR). Motional resistance corresponds to an internal equivalent resistance (i.e., oscillation loss) of the crystal resonator and can vary widely (e.g., 50-80%). Typically, for oscillation to start, the transconductance gain (i.e., $g_m$) of the amplifier exceeds a threshold value (i.e., critical value) that depends on the losses (i.e., motional resistance) of the crystal resonator. A control circuit that is powered inefficiently or that has additional complex circuitry is typically necessary to accommodate both requirements of a fast start-up and a tolerance to a wide variation of motional resistance. Otherwise, oscillation may be slow to start, and in some cases may not start at all. A need, therefore, exists for new circuits and methods to control the operation of crystal oscillators.

SUMMARY

In one general aspect, the present disclosure describes an oscillator circuit that can increase a transconductance gain at start-up in order to reduce the time for oscillation to begin and to accommodate for crystal variation, and then, after oscillation has been started, can reduce the transconductance gain in order to conserve energy while maintaining oscillation. The adjustability of the oscillator circuit can be achieved by adjusting a body bias on a transistor that supplies current to the amplifier. Accordingly, a body bias circuit is coupled to a body terminal of the transistor in order to provide the appropriate body bias voltage at the appropriate time relative to the start of oscillation.

In one possible implementation, an oscillator circuit is disclosed. The oscillator circuit includes a current mirror with a first transistor and a second transistor. The current through the second transistor is the output of the current mirror and is coupled to a crystal oscillator, which includes an amplifier in a feedback loop with a crystal resonator. To adjust the transconductance gain of the amplifier during a start-up period, the oscillator circuit includes a body bias circuit. The body bias circuit is coupled to (e.g., coupled between) the crystal oscillator and the current mirror and applies a body-bias voltage to a body terminal of the second transistor during the start-up period to increase the current through the second transistor, which increases the transconductance gain of the amplifier.

In another possible implementation, a method for controlling a crystal oscillator is disclosed. In the method, a state of the crystal oscillator is determined. Then, based on the state, a body bias voltage at a body terminal of a transistor is adjusted to adjust the current through the transistor. An amplifier of the crystal oscillator is biased using the current through the transistor to provide a corresponding transconductance. Accordingly, the transconductance of the amplifier may be adjusted to control the crystal oscillator by adjusting the body bias voltage.

In another possible implementation, a crystal oscillator is disclosed. The crystal oscillator includes a crystal resonator in a feedback loop with an amplifier. The amplifier is biased by a circuit that includes a transistor and a body bias circuit. The transistor is configured to provide a relatively high current (i.e., a current sufficient to start oscillation) to the amplifier to start oscillation based on a voltage applied to a body terminal of the transistor. The body bias circuit is configured to adjust the voltage applied to the body terminal to provide a relatively low current (i.e., a current sufficient to maintain oscillation that is lower than the current to start oscillation) to the amplifier to maintain oscillation after oscillation has started.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes circuits and methods to start (e.g., quickly start) and maintain oscillation of a crystal oscillator. The described approach is based on adjusting the transconductance gain (i.e., $g_m$) of the amplifier to a relatively high value (e.g., above a critical transconductance, $g_{m\text{-}crit}$ necessary for oscillation) at start-up to reduce the time (e.g., time necessary) for oscillation to start. Then, after oscillation has started (e.g., for a number of cycles), the $g_m$ is adjusted to a relatively low value to maintain the oscillation. Because $g_m$ is reduced after start-up, the oscillation may be maintained efficiently (i.e., using less power than at start-up). Additionally, because the $g_m$ is adjustable, the disclosed approach has the added advantage that it can accommodate a wide range of possible $g_{m\text{-}cm}$ values, without the inefficiencies associated with designs to accommodate for wide variations of $g_{m\text{-}crit}$ with a single $g_m$.

In the table below, some example transconductance values (i.e., with and without adjustment at start-up) and their corresponding oscillation start-up times are shown for different crystal oscillator implementations (i.e., at 32 kilohertz (kHz) and at 16 megahertz (MHz)). These examples are presented to facilitate understanding. The disclosure includes but is not limited to the examples values shown in, or derived from, TABLE 1.

TABLE 1

EXAMPLE START-UP TIME REDUCTIONS

| Technique | $g_m$ (µA/V) | Start-Up Time (ms) |
|---|---|---|
| 32 KHz, $g_{m\text{-}crit}$ = 2.36 | | |
| No Adjustment | 5.5 | 64.9 |
| $g_m$ Adjusted | 46 | 9.34 |
| 16 MHz, $g_{m\text{-}crit}$ = 170 | | |
| No Adjustment | 225 | 0.513 |
| gm Adjusted | 605 | 0.191 |

The adjustment of $g_m$ can be achieved by adjusting a current supplied to the amplifier. For example, a relatively high supplied current corresponds to a relatively high $g_m$, while a relatively low supplied current corresponds to a relatively low $g_m$. The present disclosure describes circuits and methods to adjust the current supplied to the amplifier without complicated automatic gain control circuits that include sensors for sensing oscillation conditions and elaborate switch networks for adjusting multiple current sources ON/OFF. Instead, the disclosed circuits and methods can simply utilize logic circuits to determine the state of the oscillator and a body terminal on a transistor to adjust the current supplied to the amplifier.

The current through a metal oxide semiconductor field effect (MOSFET) transistor may be expressed by the equation below:

$$I \propto \mu \frac{w}{l}(V_{GS} - V_T),$$

where w and l are the channel width and length, µ is the mobility, $V_{GS}$ is the gate-source voltage and $V_T$ is the threshold voltage of the device. The current, l, through the transistor (i.e., the drain-to-source current) may be adjusted by adjusting the threshold voltage, $V_T$. The disclosed circuits and methods can adjust (i.e., modulate) a threshold voltage of at least one transistor to adjust a current supplied to the amplifier as a mechanism for adjusting the transconductance of the amplifier in the crystal oscillator at start-up. In other words, for some implementations the crystal oscillator can be operated in a start-up mode with a relatively high supplied current or a steady-state mode with a relatively low supplied current. The start-up mode can ensure a relatively fast start oscillation but may be relatively inefficient, due to the relatively high supplied current. The steady-state mode can ensure sustained oscillation and may be relatively efficient due to the relatively low supplied current.

A transistor can be used as a source (or sink) of the current supplied to the amplifier. The transistor may be a p-type (i.e., PMOS) or an n-type (i.e., NMOS) transistor, and adjusting the threshold voltage ($V_T$) of the transistor may be achieved by biasing the body of the transistor at a body-bias (i.e., back-bias, back-gate, body) terminal 125. While the disclosed transistor may be utilized with a variety of technologies (e.g., bulk complementary metal oxide semiconductor (CMOS), silicon on insulator (SOI), and fully depleted silicon on insulator (FDSOI)), both SOI and FDSOI technologies can be configured for the described techniques because of their back-bias versatility.

Figure 1:
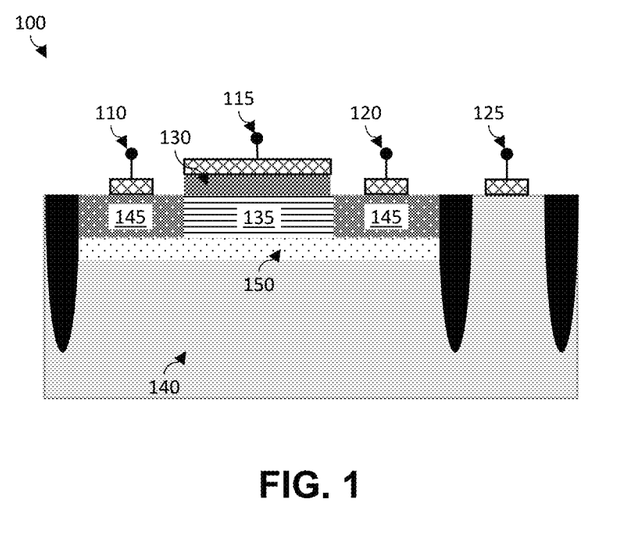
FIG. 1 is a side cross section of a fully-depleted silicon-on-insulator (FDSOI) metal oxide semiconductor field effect transistor (MOSFET) having a body-bias terminal.

An example of a FDSOI MSOFET transistor is shown in FIG. 1. The transistor 100 includes a source terminal 110, a gate terminal 115, a drain terminal 120, and a body terminal 125. The gate terminal 115 is coupled to a metal oxide layer 130 above a channel 135 that is formed during operation. In an NMOS transistor, the body 140 is a p-substrate and the source terminal 110 and drain terminal 120 are above regions 145 that are n-doped (n+). In a PMOS transistor, the body 140 is an n-well (i.e., within a p-substrate) and the source terminal 110 and drain terminal 120 are above regions 145 that are p-doped (p+). The FDSOI transistor includes a buried oxide (BOX) layer 150 insulates the channel 135 and the regions 145 from the body and facilitates the application of a range of voltages to bias the body without leakage or breakdown. An SOI MOSFET transistor may have a similar structure as the FDSOI MOSFET transistor shown in FIG. 1. One difference between the technologies is the channel 135 of the FDSOI technology transistor is fully depleted, whereas in the SOI technology transistor it is not.

In some implementations, the body bias approach for controlling current has at least an advantage of simplicity. In some implementations, the control of current only requires the adjustment of a body-bias (i.e., BB) voltage. Further, this control can be simplified even further because the BB voltage may, in some implementations, only require adjustment between one of two voltages: one voltage applied during a start-up period and another after the start-up period has finished (e.g., terminated). This is advantageous over other approaches that utilize a manifold of current sources that are individually controlled (on/off) to adjust current. The BB approach, therefore, facilitates integration (e.g., easy integration) with a crystal oscillator (i.e., on chip) because it uses (e.g., requires) relatively little additional chip space or power for controlling components.

Figure 2:
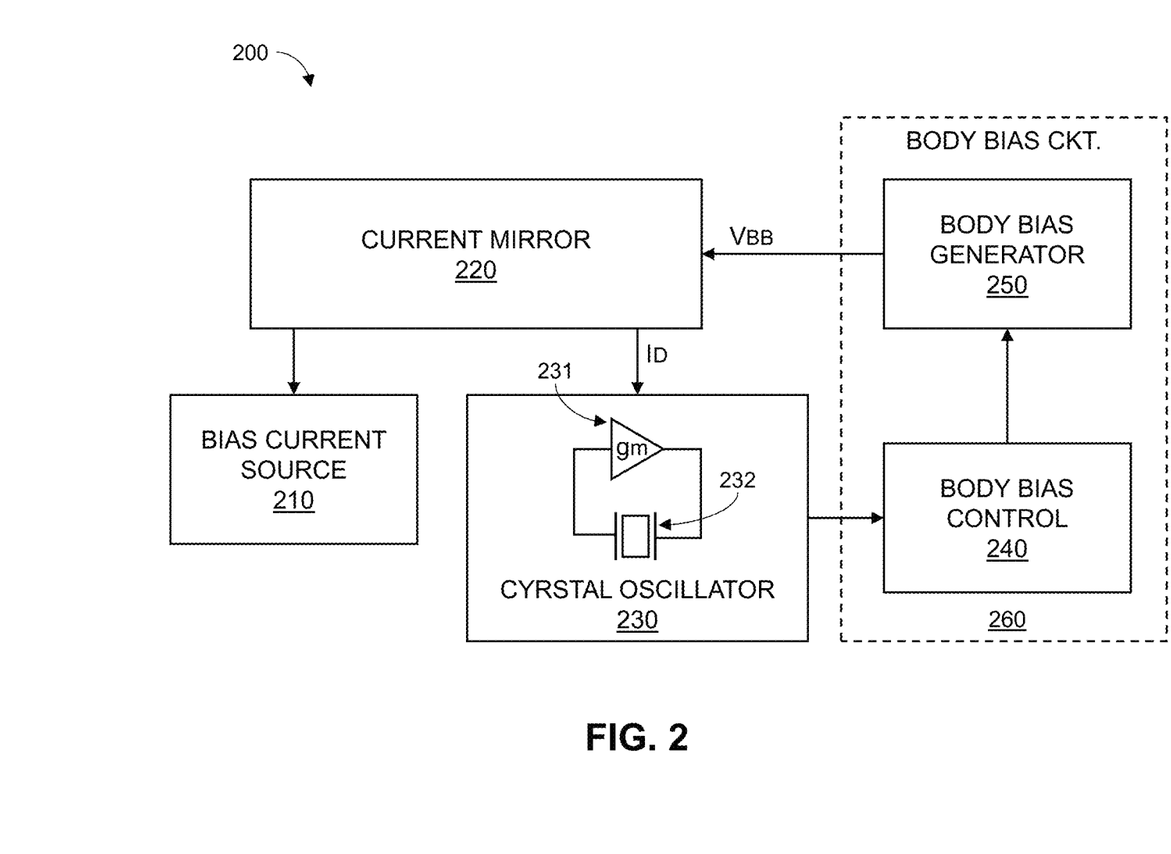
FIG. 2 graphically depicts a block diagram of a crystal oscillator circuit according to a possible implementation of the present disclosure.

FIG. 2 graphically depicts an oscillator circuit containing the features and advantages described. The oscillator circuit 200 includes a crystal oscillator 230. The crystal oscillator 230 includes a crystal resonator 232 in a feedback loop with an amplifier 231. The crystal oscillator is enabled at start-up by biasing the amplifier 231 to have a transconductance gain ($g_m$) that is above a threshold value necessary for oscillation ($g_{m\text{-}crit}$). After (e.g., immediately after) start-up, an oscillating signal is generated and increases (e.g., grows) in amplitude until it reaches a steady state oscillation, characterized by a low (e.g., less than 5%) variation in an amplitude of the oscillating signal. The time necessary for the crystal oscillator to reach steady state oscillation is the start-up time. A start-up period is a period from the time at which the crystal oscillator is enabled until (at least) the time at which steady state oscillation is achieved. In some implementations the end of the start-up period may be chosen after (e.g., after >10 cycles of the oscillating signal) steady state oscillation is expected in order to ensure that variations in start-up time do not affect control of the oscillation.

In some implementations, the crystal oscillator 230 provides an oscillating signal at a frequency that is tuned to a resonance frequency ($F_R$) characteristic of the crystal resonator 232 when configured in an ON-state (i.e., enabled). The oscillating signal may be used by other circuits (not shown) as a time reference or as a mixing signal. In some implementations, the other circuits (not shown) can control the oscillator circuit 200 to configure the crystal oscillator in an ON-state or an OFF-state. The ON/OFF state of the crystal oscillator may correspond to a power management scheme used by other circuits (not shown) to enable low power operation.

In some implementations, the oscillator circuit 200 can include a current mirror 220 to supply (i.e., bias) the amplifier 231 with a current, $I_D$. The current mirror may include two active devices (e.g., transistors) that are configured so that the current through one of the active devices (e.g., a second transistor) corresponds to (e.g., matches or is a scaled version of) the current though the other (e.g., a first transistor). In other words, the current mirror can be configured to operate as a current-controlled current source (i.e., CCCS). For the implementation shown in FIG. 2, the current controlling the current mirror is generated by a bias current source 210. When the two active devices of the current mirror 220 are matched, the current through the two active devices are substantially equal (e.g., equal). For example, if the current mirror includes two transistors that have matched threshold voltages, $V_T$, then the current through the transistors can be equal (e.g., substantially equal). If the $V_T$ of one of the transistors is adjusted, however, then the current through each transistor can be different (e.g., substantially different). For example the current through one of the two active devices (e.g., a second transistor) may be higher than (i.e., scaled up from) the current through another of the two active devices (e.g., a first transistor).

The implementation of the current mirror with two active devices is provided to help understanding and is not intended to be limiting. Other implementations of the current mirror may include a plurality of active devices (e.g., for matching purposes). In other words, the first transistor and the second transistor of the current mirror may each be embodied as a plurality of transistors.

In some implementations, the oscillator circuit 200 includes a body bias circuit 260 that receives a signal form the crystal oscillator, determines a state (i.e., mode) of the crystal oscillator 230 (i.e., start-up or steady-state), and/or generates a signal ($V_{BB}$) to control the current mirror 220 to supply a current, $I_D$, to the amplifier 231 that adjusts the transconductance gain ($g_m$) accordingly.

In some implementations, the body bias circuit may include a body bias control 240. The body bias control 240 may include circuits and components that are configured generally to receive one or more signals from the crystal oscillator and produce a first digital signal that corresponds (e.g., in frequency) to the oscillating signal. The body bias control 240 may further include circuits and components that are configured generally to determine timing information. For example, the body bias control 240 may further include a counter circuit that can count the number of cycles of the first digital signal and to produce a second digital signal after a particular number of cycles has been counted. The body bias control 240 may further include circuits and components that are configured generally to determine that a period has elapsed. For example, the body bias control 240 may further include a logic circuit that based on the timing information and an ON/OFF state of the crystal oscillator may generate a signal (e.g., pulse, transition high/low, etc.) that corresponds to (e.g., indicates) a conclusion of a start-up period and/or the beginning of a steady-state period.

In some implementations, the body bias circuit may include a body bias generator 250. As shown in the implementation of FIG. 2, the body bias generator can be coupled to the body bias control to receive a signal at the start and/or conclusion of the start-up period. Upon receiving the signal(s), the body-bias generator can produce a voltage (i.e., $V_{BB}$) for adjusting the current supplied to the amplifier. For example, the body bias generating may produce a $V_{BB}$ signal having a first voltage during a start-up period and a second voltage otherwise (e.g., after the start-up period).

In some implementations, the $V_{BB}$ signal can be coupled to a body-bias terminal of a transistor of the current mirror 220 to adjust the current, $I_D$, output from the current mirror 220. Accordingly, the body bias generator 250 may include circuits and components to produce a voltage relative to a lower rail (e.g., 0 V) and an upper rail (e.g., $V_{DD}$) of the current mirror 220 based on the signal received from the body bias control 240. The body bias generator 250 can, in possible implementations, include switches to configure components based on the signal received form the body bias control 240. For example, the body bias generator 250 may include one or more switches to control the operation (e.g., bias) of one or more voltage reference devices (e.g., diode-connected transistors) to adjust $V_{BB}$ during a start-up period. Further, the one or more switches may be configured to couple a filter to a body-bias terminal to remove noise from the $V_{BB}$ signal during a steady-state period.

In some implementations, the body bias voltage ($V_{BB}$) applied during a start-up period can be different from the body bias voltage applied otherwise in a steady state period. For example, $V_{BB}$ can be adjusted to a start-up voltage (i.e., $V_{BB-START}$) from a default (e.g., steady-state) voltage (i.e., $V_{BB-STEADY}$) during the start-up period to increase the current ($I_D$) supplied to the amplifier at start-up.

In some implementations, the direction of the adjustment (i.e., higher or lower) can be determined by the type of transistors used in the current mirror. For example, if the transistors are PMOS, then $V_{BB-STEADY}$ may be a high supply voltage (e.g., $V_{DD}$) and $V_{BB-START}$ may be a voltage lower than $V_{DD}$ to increase $I_D$ (i.e., reduce $V_T$). Alternatively, if the transistors are NMOS, then $V_{BB-STEADY}$ may be a low supply voltage, such as a ground voltage (e.g., 0 V), and $V_{BB-START}$ may be a voltage higher than the ground voltage (e.g. 0V) to increase $I_D$ (i.e., reduce $V_T$).

In some implementations, the amount of adjustment during a start-up period (i.e., the value of $V_{BB-START}$) can be any voltage between (and including) the ground voltage (e.g., 0V) and a supply voltage (e.g., $V_{DD}$) of the current mirror. For example, the adjusted start-up times shown in TABLE 1 are based on a $V_{BB-START}$ that is reduced from the supply voltage (i.e., $V_{DD}$) by a voltage drop across a (biased) diode-connected transistor. Had $V_{BB}$ been reduced even lower (e.g., 0V), the adjusted start-up times in TABLE 1 would have been even shorter compared to their unadjusted counterparts. The choice of $V_{BB}$ during start-up may be a balance of parameters including (but not limited to) power consumption, circuit complexity, circuit size, and crystal resonator variation. For example, more complicated and/or larger implementations of the circuits and methods disclosed could be devised to distinguish a plurality of period designations and/or provide a plurality of $V_{BB}$ voltages (e.g., one for each period designated).

Figure 3:
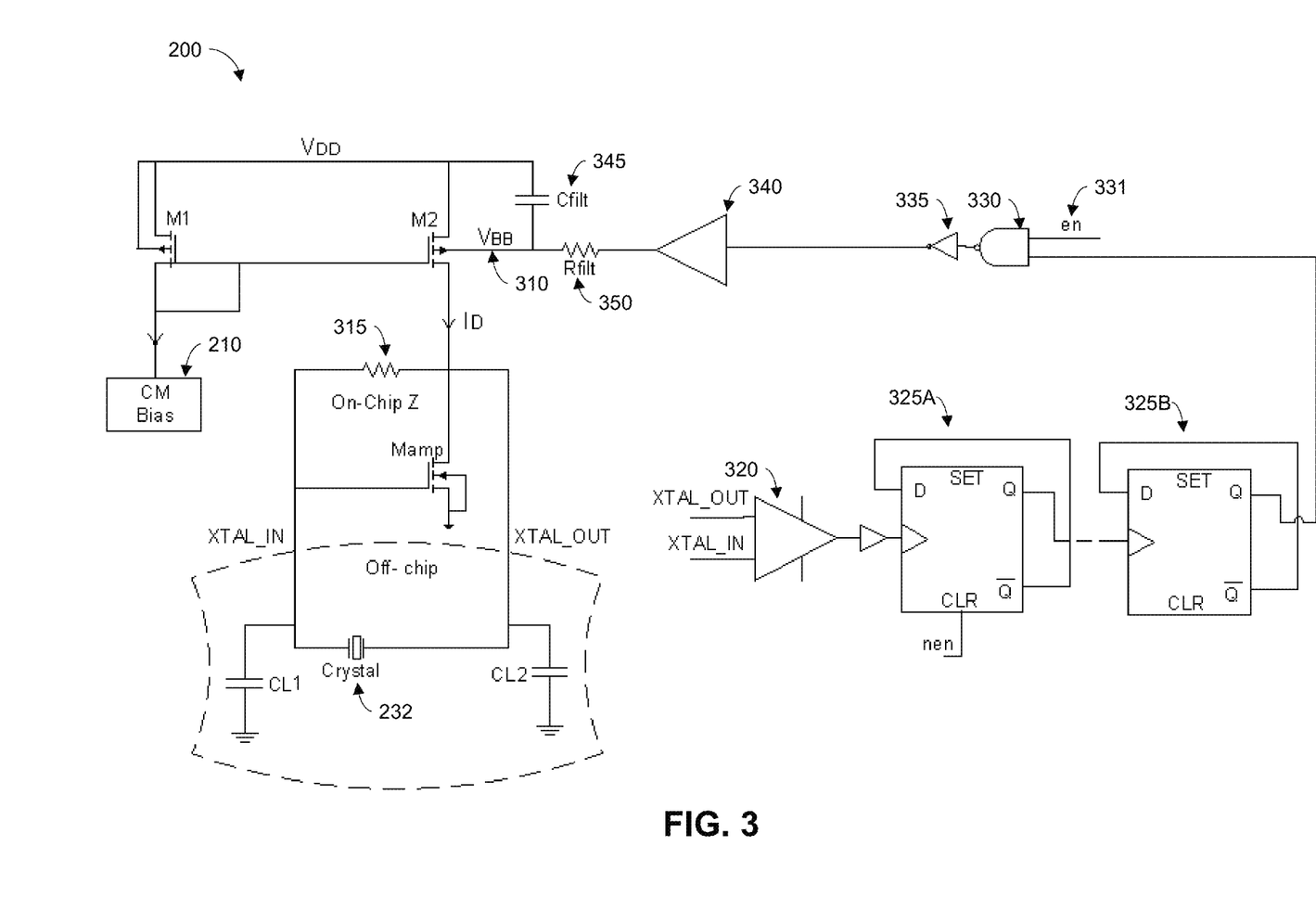
FIG. 3 schematically depicts a first possible implementation of the oscillator circuit of FIG. 2.

FIG. 3 schematically depicts a first possible implementation of the oscillator circuit of FIG. 2. As shown, transistors M1 and M2 form a current mirror 220. M1 is a PMOS transistor that is shorted between its gate terminal and its drain terminal and coupled at its drain to bias current source 210 (i.e., current-mirror (CM) bias). For this implementation, the bias current source 210 may be an NMOS transistor that sinks a bias current to ground. A body terminal of M1 is coupled to a supply voltage, $V_{DD}$, of the current mirror. M2 is a PMOS transistor that is coupled at its gate to the gate of M1. A body-bias terminal 310 (i.e., body terminal) of M2 is coupled to a body bias generator output (i.e., $V_{BB}$). In this way, the body bias voltages applied to M1 and M2 may be adjusted to be the same (i.e., $V_{BB}=V_{DD}$) or different (i.e., $V_{BB}<V_{DD}$), and likewise the current through each transistor may be adjusted to be the same or different.

In some implementations, the output of the current mirror 220 (i.e., $I_D$) is provided (e.g., fed) to an amplifier, $M_{amp}$, in the crystal oscillator 230. The amplifier, $M_{amp}$, for the implementation shown is NMOS transistor that is biased by the current flowing through M2 and by a feedback resistor 315 (e.g., a high resistance on-chip Z). The feedback resistor 315 can be designed as a poly-silicon resistor or any suitable element available in the process technology that can provided high resistance. The NMOS transistor ($M_{amp}$) can be coupled to the input (i.e., XTAL_IN) and the output (i.e., XTAL_OUT) of a crystal resonator 232 (i.e., crystal) at its gate and drain terminals, respectively, while the source terminal is grounded.

The crystal resonator 232 can be coupled to the amplifier externally (i.e., off chip). When coupled externally (off chip), potential variations in the crystal resonator 232 must be accommodated for by the on-chip circuitry. For example, the motional resistance (Rm) of the crystal resonator 232 may vary widely (50-80%) from piece to piece. The critical transconductance gain (i.e., $g_{m-crit}$) for oscillation can vary likewise because $g_{m-crit}$ is typically proportional to Rm. Raising the transconductance gain of the amplifier, $M_{amp}$, during start-up can accommodate for variations in the motional resistance of an (off chip) crystal resonator 232 without (e.g., without the need for) permanently maintaining a high transconductance gain, which can be power inefficient.

In some implementations, the oscillator circuit implementation of FIG. 3 also includes a body bias control 240. The bias control includes a comparator 320 that compares the XTAL_OUT and XTAL_IN signals to produce a digital signal that oscillates between a high/low values at the frequency of the oscillator. The body bias control 240 further includes a counter circuit to count cycles. The counting may be performed using a divide-by-N (i.e., divide-by, divider, etc.) circuit (i.e., counter). The divide-by circuit can include a plurality of series connected D flip-flops 325A, 325B, where each flip flow divides the frequency of the input signal but two. For example, the series connection of two flip-flops divides the digital oscillating frequency by four. Any number of flip-flops may be used to define a start-up period and produce a positive signal after the start-up period. The body bias control 240 also includes logic gates. As shown, the gates can include a NAND gate 330 and an inverter 335 to perform a logical AND operation. The AND operation delivers a logical high (i.e., true, one, etc.) when an enable signal 331 is high (i.e., the oscillator circuit is powered) and when the signal from the divide-by circuit is high (i.e., after the start-up period).

In some implementations, a body bias generator 250 is coupled to the logical output of the body bias control 240. The body bias generator, for the implementation shown in FIG. 3, includes a logical driver 340. The logical driver outputs a low supply voltage (e.g., 0V) to the body-bias terminal 310 of M2 when the body bias control outputs a logical low (i.e., during the start-up period) and outputs a high supply voltage (e.g., $V_{DD}$) to the body-bias terminal 310 of M2 when the body bias control outputs a logical high (i.e., after the start-up period and while the circuit is enabled). In some implementations, the body bias generator further includes a filter including a capacitor ($C_{filt}$) 345 and a resistor ($R_{filt}$) 350 to eliminate possible noise at the body terminal.

In some implementations, the first possible implementation shown in FIG. 3 can include a very low (e.g., zero volts) $V_{BB}$ at start (i.e., $V_{BB\text{-}START}$) and therefore is expected to have a start-up time that is greatly reduced from an unadjusted start-up time (e.g., >5× reduction in start-up time). The body bias generator of the first implementation is very simple, having only a few components (e.g., logical driver 340 and filter).

Figure 4:
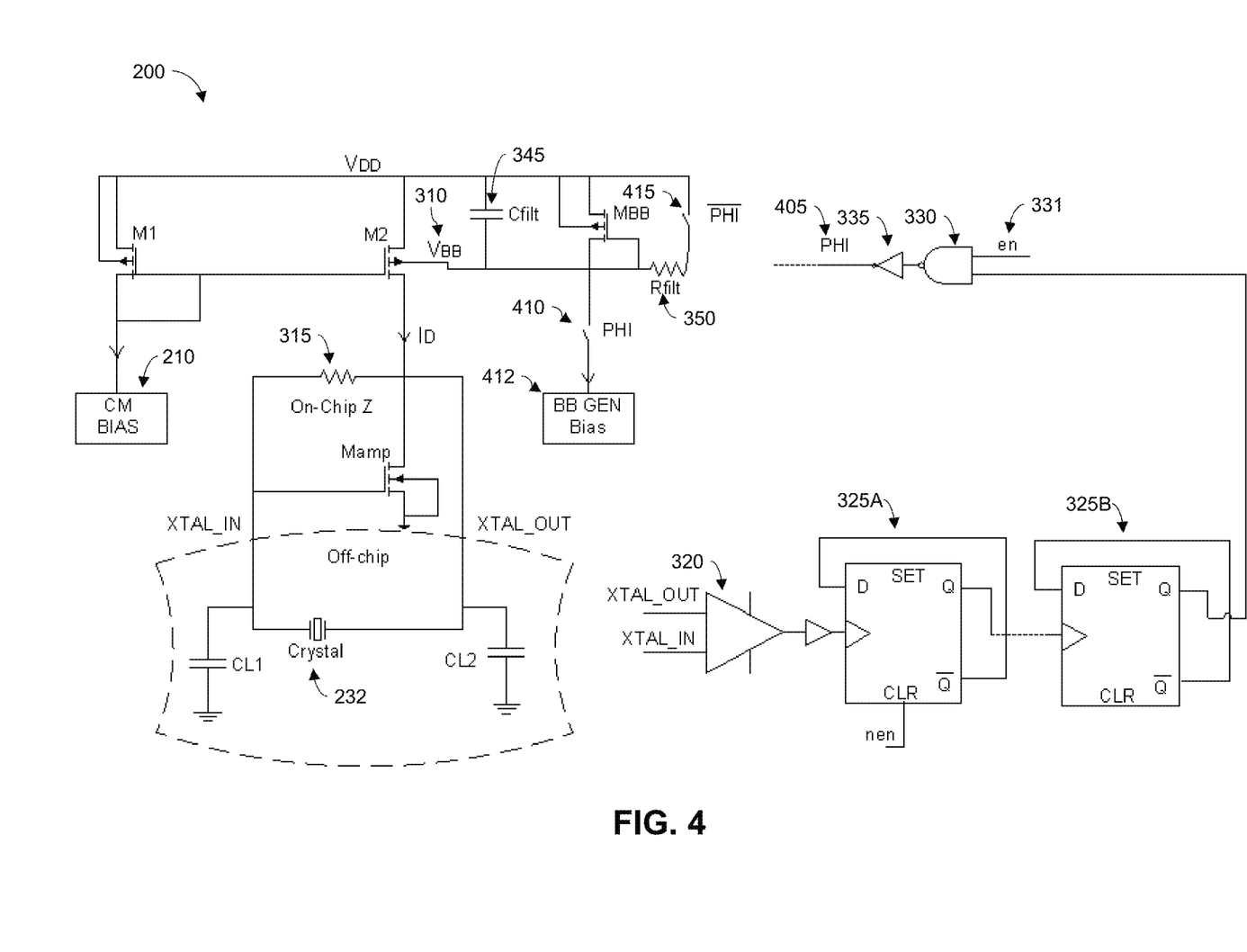
FIG. 4 schematically depicts a second possible implementation of the oscillator circuit of FIG. 2.

FIG. 4 schematically depicts a second possible implementation of the oscillator circuit of FIG. 2. The implementation of the oscillator circuit 200 shown in FIG. 4 differs from the implementation shown in FIG. 3 in the body bias generator. In particular, the body-bias voltage ($V_{BB}$) generated by the two different circuits differ. The body bias generator 250 for the implementation shown in FIG. 3 generates a $V_{BB}$ that is a ground voltage (e.g., zero volts) during a start-up period. The body bias generator 250 for the implementation shown in FIG. 4, however, generates a $V_{BB}$ and that is above the ground voltage. In particular, $V_{BB}$ can be adjusted to be lower than supply voltage, $V_{DD}$, by a voltage drop that can be switched into the circuit during the start-up period.

The voltage drop (i.e., $V_{DROP}$) at the body-bias terminal during the start-up period may be created using a variety of possible components and circuitry. For example, the voltage drop may be created using one or more diodes, one or more resistors, or one or more diode-connected transistors. The one or more components may be electrically enabled by one or more switches or otherwise electrically enabling the one or more components to provide a particular voltage drop. For example, in some implementations that utilizes a single component to provide a single voltage drop, the component can enabled during the start-up period to provide $V_{BB\text{-}START}$ (e.g., $V_{BB\text{-}START}=V_{DD}-V_{DROP}$) and disabled to provide $V_{BB\text{-}STEADY}$ (e.g., $V_{BB\text{-}STEADY}=V_{DD}$). In some implementations, multiple components can be utilized to provide multiple possible voltage drops, depending on how they are electrically enabled.

The body bias generator 250 of the implementation shown in FIG. 4 includes a diode-connected PMOS transistor (i.e., $M_{BB}$) that is coupled at its source terminal to a source voltage ($V_{DD}$). The PMOS transistor $M_{BB}$ is shorted between its gate and drain, and the drain of $M_{BB}$ is coupled to a bias current source 412 (i.e., BB GEN Bias). In this possible implementation, the bias current source 412 may be an NMOS transistor that sinks a bias current to ground when a first switch 410 is configured in an ON state.

The body bias generator 250 of the implementation shown in FIG. 4 includes logical gates (i.e., inverter 335 and NAND gate 330) to produce a control signal 405 (i.e. PHI). The body bias generator also includes the first switch 410 and a second switch 415 that can each be configured in an ON or an OFF state based on the voltage of the control signal 405. For example, the first switch 410 can be configured ON (i.e., closed, conducting, etc.) while the second switch 415 is configured OFF (i.e., open, non-conducting, etc.). This complementary function of the switches can be accomplished in different ways. For example, the control signal may be inverted at one of two identical switches, as shown in FIG. 4. Alternatively, the switches may be different and operate in complementary fashion in response to the same control signal.

During the start-up period, PHI can be a high-level signal and can close the first switch 410 and open the second switch 415. When the first switch 410 is closed, MBB conducts current in saturation mode with a voltage drop around the threshold voltage ($V_T$) of the device. Accordingly, the voltage at the body terminal of M2 (i.e., $V_{BB}$) is pulled-down to a voltage less than the source voltage (i.e., $V_{DD}$) by the voltage drop across the diode-connected transistor ($V_{DROP} \approx 0.6$ V). After the start-up period, PHI can be a low signal and can open the first switch 410 and close the second switch 415. In this configuration, the voltage at the body terminal (i.e., $V_{BB}$) is no longer pulled down but rather is coupled to the source voltage, $V_{DD}$, by a filter that includes the capacitor $C_{filt}$ 345 and the resistor, $R_{filt}$, 350.

Figure 5:
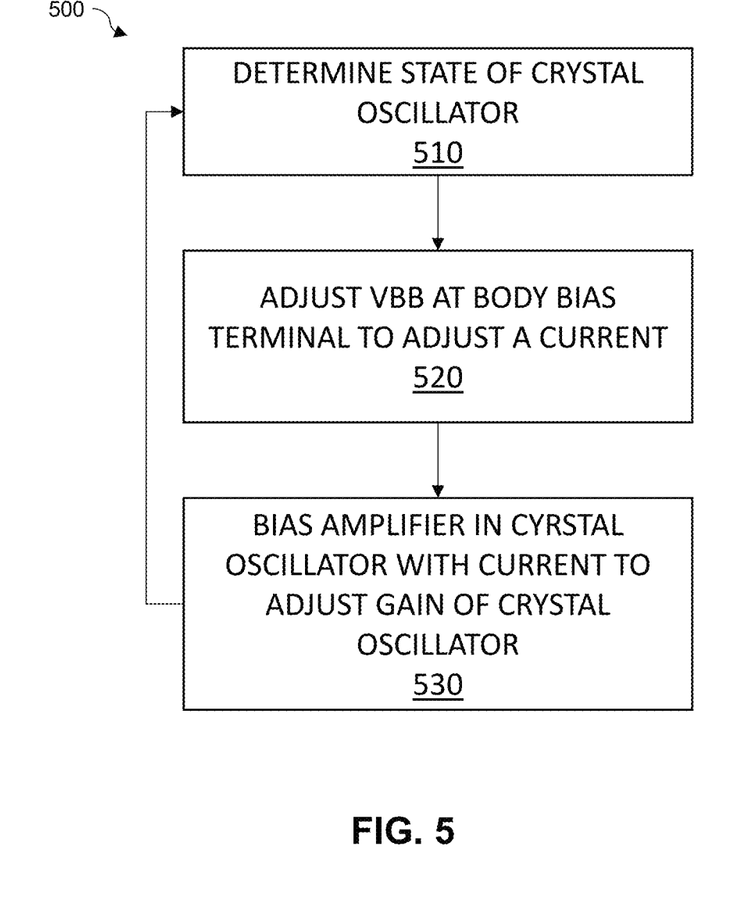
FIG. 5 is a flow chart of a method for controlling a crystal oscillator.

FIG. 5 is a flow chart of a method 500 for controlling a crystal oscillator. The method includes determining 510 a state of the crystal oscillator. The state of the crystal oscillator may be a start-up state (e.g., during a start-up period). As described previously, the state may be determined by a body bias control 240 that counts a number of cycles in the oscillation. A count may begin when the crystal oscillator is enabled and end after a predetermined number of cycles. Accordingly, the oscillator may be considered in a start-up state during a time between a time at which the crystal oscillator was enabled and a time at which the count has reached the predetermined value. Some implementations may not make further determinations other than start-up state and not-start-up state. In some implementations, however, other states may be determined. For example, a steady state may be concluded as immediately following the start-up state and continuing until the crystal oscillator is disabled (i.e., until a disabled state). While other approaches for making the determination are possible, the cycle counting approach may be desirable for its simplicity, as only a few components (e.g., comparator and flip-flops) are required.

After the state of the crystal oscillator is determined, the method 500 includes adjusting 520 a body bias voltage ($V_{BB}$) at a body terminal of a transistor based on the state. The body bias voltage corresponds to the current through the transistor. As described previously, the $V_{BB}$, during a start-up period, may be generated by a body bias generator 250 differently than generated otherwise. For example during the start-up period, $V_{BB} < V_{DD}$ for a PMOS transistor (or $V_{BB} > V_{DD}$ for a NMOS transistor), while after the start-up period $V_{BB} = V_{DD}$ for a PMOS transistor (or $V_{BB}$=ground for a NMOS transistor).

The method 500 further includes biasing 530 an amplifier of the crystal oscillator using the current through the transistor (e.g. a transistor in a current mirror 220). The current through the transistor depends on a threshold voltage of the transistor, which in turn, depends on the body bias voltage, $V_{BB}$. Accordingly, adjusting the body bias voltage corresponds to adjusting the current through the transistor. The current through the transistor is used to bias an amplifier 231 of the crystal oscillator. The transconductance gain (i.e., $g_m$) of the amplifier depends on (e.g., is proportional to) the biasing current. Accordingly, adjusting the body bias voltage further corresponds to adjusting the transconductance gain of the amplifier. What is more, the transconductance gain of the amplifier (e.g., relative to a motional resistance) corresponds to (e.g., is inversely proportional to) the start-up time of the amplifier. Accordingly, adjusting the body bias voltage further corresponds to adjusting the start-up time of the amplifier.

The adjustment of the body bias voltage may be facilitated by the use of a fully depleted silicon on insulator (FDSOI) transistor technology or a silicon on insulator (SOI) transistor technology. Both technologies have a structure suitable for body biasing because, in both cases, the amplitude of the body biasing is not limited by leakage or latch up, as it is with other technology (e.g., bulk) transistors. While both SOI and FDSOI technologies may be used, transistors of the SOI technology may respond to the body bias more slowly than transistors of the FDSOI technology.

The disclosed circuits and methods may provide various amounts of transconductance gain adjustment via various circuits and components for body biasing. Those skilled in the art will appreciate that adaptations and modifications of the disclosed circuits and methods can be configured without departing from the scope and spirit of the disclosure. Therefore, it is to be understood that, within the scope of the appended claims, the disclosure may be practiced other than as specifically described herein.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

In the specification, when an element, such as a component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

In the specification, the use of the term "and/or" includes any and all combinations of one or more of the associated listed items. Unless otherwise noted, specific terms have been used in a generic and descriptive sense and not for purposes of limitation. Unless defined otherwise, all technical and scientific terms used herein have the same meaning as commonly understood by one of ordinary skill in the art. The singular forms, such as "a," "an," and "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The invention claimed is:

1. An oscillator circuit, comprising:
an adjustable current mirror, including a first transistor and a second transistor, wherein a current through the second transistor is an output of the adjustable current mirror, the current through the second transistor controllable by a body bias voltage applied to a body terminal of the second transistor;
a crystal oscillator coupled to the output of the adjustable current mirror and including an amplifier in a feedback loop with a crystal resonator, the amplifier having a transconductance gain corresponding to the current through the second transistor; and
a body bias circuit, coupled to the crystal oscillator and the adjustable current mirror, the body bias circuit configured to apply the body bias voltage to the body terminal of the second transistor during a start-up period to increase the current through the second transistor.

2. The oscillator circuit according to claim 1, further comprising a bias current source coupled to the first transistor that generates a current through the first transistor.

3. The oscillator circuit according to claim 1, wherein the second transistor is a fully depleted silicon on insulator (FDSOI) technology transistor or a silicon on insulator (SOI) technology transistor.

4. The oscillator circuit according to claim 3, wherein a body terminal of the first transistor is connected to a supply voltage and the body terminal of the second transistor is coupled to the body bias circuit so that during the start-up period the current through the first transistor is not equal to the current through the second transistor.

5. The oscillator circuit according to claim 3, wherein the amplifier is a transistor is biased by the current through the second transistor of the adjustable current mirror to provide a first transconductance during the start-up period and a second transconductance after the start-up period.

6. The oscillator circuit according to claim 5, wherein the first transconductance is higher than the second transconductance, and wherein the first transconductance and the second transconductance are higher than a motional resistance of the crystal resonator.

7. The oscillator circuit according to claim 1, wherein the body bias circuit includes:
a body bias control, coupled to the output of the crystal oscillator, that includes at least one flip-flop configured as a divide-by circuit to count cycles of oscillation to determine the start-up period.

8. The oscillator circuit according to claim 7, wherein the body bias control includes:
a body bias generator, coupled to the body bias control, and configured to output the body bias voltage according to the start-up period determined by the body bias control.

9. The oscillator circuit according to claim 8, wherein the body bias generator includes at least one logic gate and a logic driver, the body bias generator configured by the output of the body bias control to:
apply a first logic level voltage to the body terminal of the second transistor during the start-up period, and
apply a second logic level voltage to the body terminal of the second transistor after the start-up period.

10. The oscillator circuit according to claim 9, wherein the body bias generator includes a diode-connected transistor and a switch network, the switch network configured by the output of the body bias control to:
bias the diode-connected transistor so that a first body bias voltage is applied during the start-up period; and
unbias the diode-connected transistor so that a second body bias voltage applied after the start-up period.

11. The oscillator circuit according to claim 8, wherein the body bias generator includes a filter that is configured to reduce noise on the body terminal after the start-up period.

12. A method for controlling a crystal oscillator, comprising:
determining a state of the crystal oscillator;
adjusting, based on the determined state, a body bias voltage at a body terminal of a transistor of an adjustable current mirror to control a current through the transistor of the adjustable current mirror; and
biasing an amplifier of the crystal oscillator using the current through the transistor of the adjustable current mirror to adjust a transconductance gain of the amplifier based on the state.

13. The method for controlling a crystal oscillator according to claim 12, further comprising:
determining that the crystal oscillator is in a start-up state;
adjusting the body bias voltage at the body terminal of the transistor of the adjustable current mirror to increase the current through the transistor of the adjustable current mirror; and
biasing the amplifier of the crystal oscillator using the increased current to increase the transconductance gain of the amplifier.

14. The method for controlling a crystal oscillator according to claim 12, further comprising:
determining that the crystal oscillator is not in a start-up state;
adjusting the body bias voltage at the body terminal of the transistor of the adjustable current mirror to decrease the current through the transistor of the adjustable current mirror; and
biasing the amplifier of the crystal oscillator using the decreased current through the transistor of the adjustable current mirror to decrease the transconductance gain of the amplifier.

15. The method for controlling a crystal oscillator according to claim 12, wherein the transistor of the adjustable current mirror is a fully depleted silicon on insulator (FDSOI) transistor or a silicon on insulator (SOI) transistor.

16. The method for controlling a crystal oscillator according to claim 12, wherein an oscillation of the crystal oscillator is at any frequency in a kilohertz to megahertz range.

17. The method for controlling a crystal oscillator according to claim 12, wherein the determining a state of the crystal oscillator includes counting a number of cycles in an oscillating signal from the crystal oscillator.

18. The method for controlling a crystal oscillator according to claim 12, wherein:
when the transistor of the adjustable current mirror is a PMOS transistor, the adjusting includes reducing the body bias voltage at the body terminal from a supply voltage to increase the current through the transistor of the adjustable current mirror; and
when the transistor of the adjustable current mirror is an NMOS transistor, the adjusting includes increasing the body bias voltage at the body terminal from a ground voltage to increase the current through the transistor of the adjustable current mirror.

19. A crystal oscillator comprising:
a crystal resonator in a feedback loop with an amplifier, the amplifier being biased by a circuit including:
an adjustable current mirror including a transistor configured to provide a first current to the amplifier that is sufficient to start oscillation, the first current sufficient to start oscillation being based on a first voltage applied to a body terminal of the transistor; and
a body bias circuit configured to apply a second voltage to the body terminal of the transistor after oscillation has started, the second voltage configuring the transistor to provide a second current to the amplifier that is sufficient to maintain oscillation, the first current sufficient to start oscillation higher than the second current sufficient to maintain oscillation.

20. The crystal oscillator according to claim 19, wherein the transistor is a fully depleted silicon on insulator (FDSOI) transistor or a silicon on insulator (SOI) transistor.

* * * * *